US006741445B1

(12) United States Patent
Phan et al.

(10) Patent No.: US 6,741,445 B1
(45) Date of Patent: May 25, 2004

(54) METHOD AND SYSTEM TO MONITOR AND CONTROL ELECTRO-STATIC DISCHARGE

(75) Inventors: Khoi A. Phan, San Jose, CA (US); Bhanwar Singh, Morgan Hill, CA (US); Bharath Rangarajan, Santa Clara, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 122 days.

(21) Appl. No.: 10/050,458

(22) Filed: Jan. 16, 2002

(51) Int. Cl.$^7$ ................................................ H01T 23/00
(52) U.S. Cl. ..................................... 361/230; 361/230
(58) Field of Search ........................ 361/56, 233, 234, 361/226, 227, 228, 230, 231, 232

(56) References Cited

U.S. PATENT DOCUMENTS

| | | | | |
|---|---|---|---|---|
| 4,675,530 A | * | 6/1987 | Rose et al. ............. 250/492.2 |
| 5,308,447 A | * | 5/1994 | Lewis et al. ................. 216/23 |
| 5,474,877 A | * | 12/1995 | Suzuki ....................... 430/325 |
| 5,475,319 A | * | 12/1995 | Hirae et al. ................. 324/765 |
| 5,587,587 A | * | 12/1996 | Hashimoto ............. 250/492.21 |
| 5,721,090 A | * | 2/1998 | Okamoto et al. ........... 430/313 |
| 6,162,565 A | * | 12/2000 | Chao et al. ..................... 430/5 |
| 6,232,134 B1 | * | 5/2001 | Farber et al. ................... 438/9 |
| 6,458,704 B2 | * | 10/2002 | Carlson ....................... 438/692 |

* cited by examiner

Primary Examiner—Gregory J Toatley, Jr.
Assistant Examiner—Danny Nguyen
(74) Attorney, Agent, or Firm—Amin & Turocy, LLP (57) ABSTRACT

A system and methodology is provided for monitoring and controlling static charge during wafer and mask fabrication. The static charge on a target device is monitored. If the static charge becomes too high, corrective actions are taken to reduce the static charge. An antistatic solution is dispensed on the target device. The system and methodology provided reduce damage resulting from electrostatic discharge during fabrication. The system and methodology also reduce delays during fabrication by automatically controlling static charge without the need for manual intervention.

30 Claims, 11 Drawing Sheets

METHOD AND SYSTEM TO MONITOR AND CONTROL ELECTRO-STATIC DISCHARGE

FIELD OF INVENTION

The present invention relates generally to development processes for semiconductor fabrication and in particular to systems and methods to monitor and control electro-static discharge during semiconductor fabrication.

BACKGROUND OF THE INVENTION

Semiconductor devices are becoming smaller and faster. This decrease in size requires that the dimensions and critical dimensions (CD) of semiconductor devices must also decrease. However, as the dimensions and size semiconductor devices become smaller, static charges become more of a problem.

Static charge is generally produced when two materials initially in contact are separated. One surface becomes positively charged as it loses electrons. The other becomes negatively charged as it gains electrons. Static charges can build up on wafers, storage boxes, work surfaces, fabrication equipment and the like. Static charges can reach voltages as high as 50,000 V.

Static charge can create device operational problems. It is possible that an electrostatic discharge (ESD) of up to 10 A can occur on a semiconductor device. Such levels of ESD can physically destroy or damage semiconductor devices and integrated circuits. Additionally, photomasks and reticles are sensitive to ESD. A single ESD can vaporize and destroy portions of a photomask or mask.

Static charge also creates a problem for measuring and inspecting semiconductor devices. As these CDs get closer to the resolution limits of optical lithography and microscopy measurement techniques, great care must be taken to eliminate all possible sources of measurement error in order to obtain accurate and reproducible CDs. A common measurement technique is scanning electron microscopy (SEM), which utilized highly focused energetic beams of electrons impinging on the sample and measures the yield of secondary emitted electrons. SEM is widely used for measurement due to its high resolution, about 10–30 Angstroms, and relative ease of use.

Figure 1:
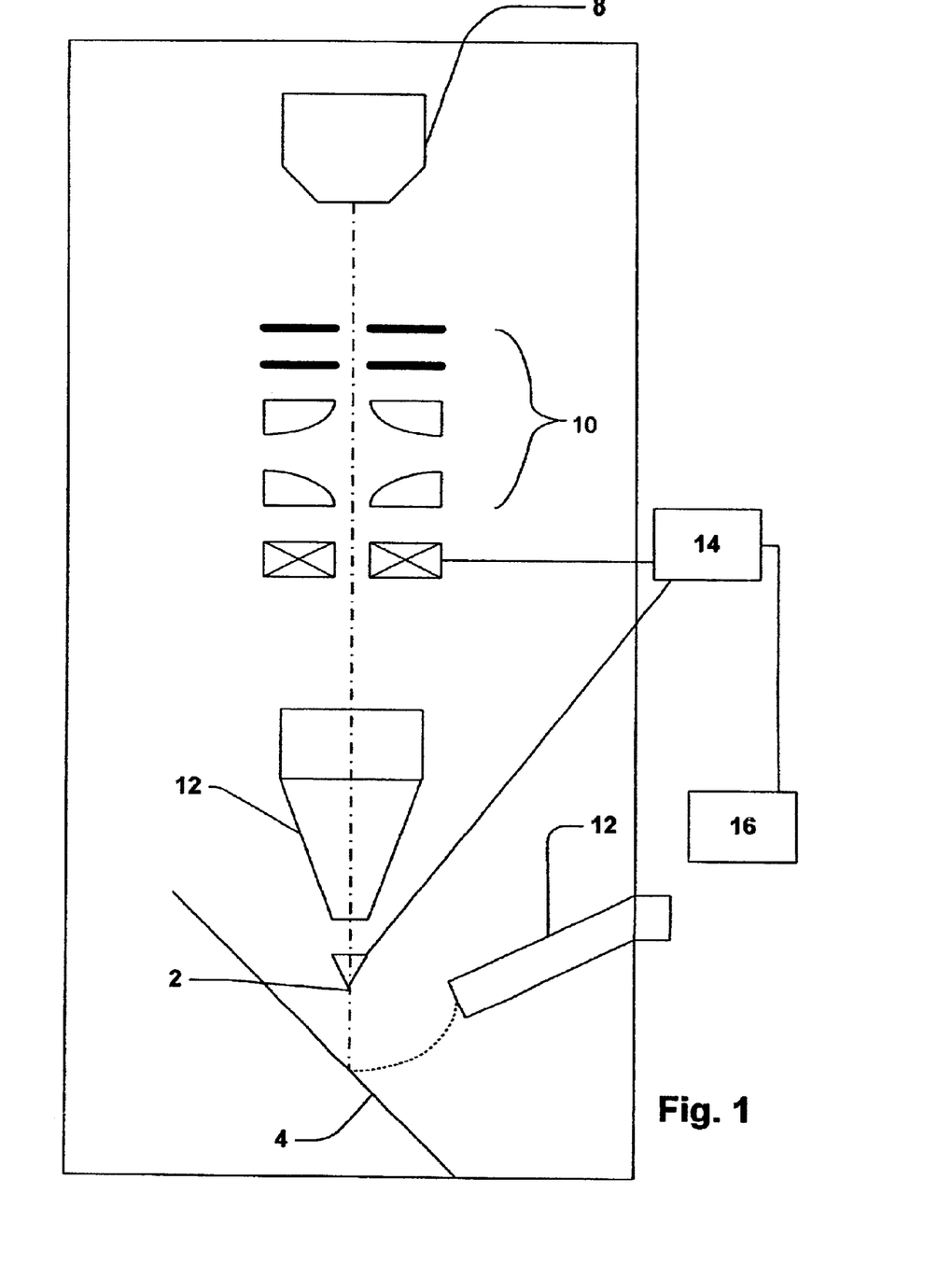
FIG. 1 is a conventional scanning electron microscope.
Figure 2:
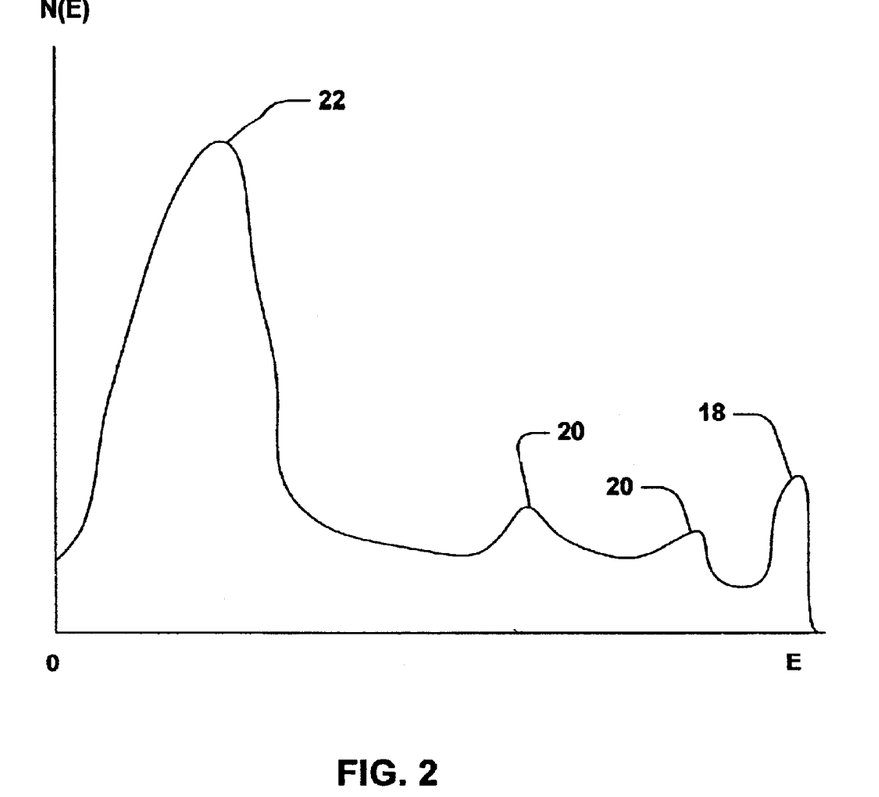
FIG. 2 is a graph illustrating a typical electron energy spectrum resulting from the incident electron beam of a scanning electron microscope.

FIG. 1 illustrates a SEM system, showing the electron source and the acceleration, focusing, and detection electronics. The system includes an incident electron beam 2 impinging on a sample 4. Secondary electrons are collected and detected at detector 6. The system also includes an electron beam source 8, accelerating and focusing electrodes 10, lens apparatus 12, scan control 14 and monitor 16. FIG. 2 shows a typical electron energy spectrum resulting from the incident electron beam of an SEM. A backscattering peak 18 is at near the incident beam energy. Auger peaks 20 and secondary electron emission peak 22 are at lower energies. Generally, secondary electrons 22 are detected by the SEM and employed for analysis. The highest energy peak results from the backscattered electrons, which have energies close to that of the incident beam, and which have undergone only elastic collisions with the target atoms. Peaks 20 seen at intermediate energies are the Auger electrons emitted due to relaxation of electrons between atomic energy levels. The lowest energy emitted electrons 22, produced by inelastic collisions between the primary beam and the inner shell electrons of the sample are known as the secondary electrons and are generally useful for morphology studies. This is partially due to the short escape depth of secondary electrons, which yields high surface sensitivity. Additionally, since the incident electron beam undergoes beam broadening due to multiple collisions as it penetrates into the sample, the backscattered electrons originating from deeper into the sample reflect this broadening with degraded point-to-point resolution. The lower energy secondary electrons that escape the sample originate from the surface region above the penetration depth where beam broadening becomes influential, and therefore yield higher point-to-point resolution. than evidenced by backscattered electrons.

The detected electron current, typically chosen to be the secondary electron current as described above, is used to intensity modulate the z-axis of a CRT. An image of the sample surface is produced by synchronously raster scanning the CRT screen and the electron beam of the SEM.

The contrast of the image depends on variations in the electron flux arriving at the detector, and is related to the yield of emitted electrons per incident electron. The yield is dependent on both the work function of the material and the surface curvature. These factors allow the SEM to distinguish between materials such as metal, oxide, and silicon, and also to distinguish surfaces that differ in slop. Thus, CDs of patterned and/or etched lines and gaps can be measured.

Two factors affecting the accuracy of SEM measurements are resolution and charging effects. The resolution of the SEM depends on the type of sample under inspection and on the incident beam diameter or "spot size". The high voltages of the electron beam required to produce small scanning spot sizes were historically on of the sources for charging of the surface when examining insulating surfaces. When incident beam energies exceeded the secondary electron crossover point, i.e., when the incident beam penetration depth was high enough that the number of emitted secondary electrons was less than the number of incident electrons, the surface in the region of the scanning beam would acquire excess negative charge. This would cause the incident beam trajectory to be disturbed and would therefore degrade the image. Grounding schemes such as coating the surface with gold and attaching a ground wire to the coating were used to attempt to reduce charging effects. However, these methods prohibited further processing following inspection of the wafers. More recent SEM machines have eliminated high energy accelerating voltages, thus eliminating that source of charging. High voltage SEMs with gold coated samples are still used to verify CDs as measured in low-voltage SEMs.

Semiconductor devices are often measured after or during photomasking processes. These photomasking processes typically include a resist or developer drying process wherein a wafer is spun at a high speed. The rapid acceleration and high speed of the drying step commonly causes high levels of static charge to build up. Aside from causing damage to the semiconductor devices on the wafer, the static charge can also prevent measurement of CDs. For example, the image focus or an SEM can be degraded due to deflection of the incident e-beam by static charge.

There exist a number of conventional ways to control and prevent static charge buildup. Fabrication stations may discharge static from equipment and operators by utilizing grounding wrist straps, antistatic garments, antistatic processing equipment and grounding work surfaces. Additionally, ionizers may be placed by filters to attempt to neutralize any static charge buildup on filtered air. Another way of reducing static charge is by manually rinsing a wafer or manually applying a solution to a wafer. A solution, such as a water, may be sprayed at a high pressure to remove statically attached particles. However, these conventional ways to reduce static charge may not work and do not detect high levels of static charge and prevent higher levels of static charge from developing. Furthermore, these conventional ways require manual intervention.

Therefore, there is an unmet need in the art for new and improved system and method for monitoring and controlling static charges in semiconductor and mask fabrication.

SUMMARY OF THE INVENTION

A system and methodology is provided for monitoring and controlling static charge during processing of semiconductor devices and masks.

An electrostatic discharge monitor and control system according to one aspect of the invention is disclosed. The system includes a cup holder, an antistatic solution dispenser, a sensor arm, a sensor and a controller. The cup holder holds a target device. The antistatic solution dispenser dispenses an antistatic solution on the target device. A sensor arm is attached to the cup holder. The sensor is attached to the sensor arm. The sensor monitors and detects static charge or static buildup on the target device. The controller is coupled to the antistatic solution dispenser, the sensor arm and the sensor. The controller receives monitoring data from the sensor. The controller controls dispensing of the antistatic solution. The controller controls positioning of the sensor and controls moving of the sensor arm. The controller continues to receive feedback monitoring data from the sensor during dispensing of the antistatic solution. The controller can modify the discharge rate of the antistatic solution and/or the composition of the antistatic solution based on the received feedback monitoring data.

An electrostatic discharge monitor and control system according to one aspect of the invention is disclosed. The system includes a cup holder, an antistatic solution dispenser, a sensor and a controller. The cup holder holds a target device. The antistatic solution dispenser dispenses an antistatic solution on the target device. The sensor is attached to the antistatic solution dispenser. The sensor monitors and detects static charge or static buildup on the target device. The controller is coupled to the antistatic solution dispenser and the sensor. The controller receives monitoring data from the sensor. The controller controls dispensing of the antistatic solution. The controller controls positioning of the sensor.

A method according to one aspect of the invention is disclosed. A target device is provided. A drying process is performed on the target device. A static charge on a surface of the target device is monitored during the drying process. A corrective action is initiated if the static charge exceeds a threshold value.

A method for controlling static charge according to one aspect of the invention is disclosed. A base value is established for a target device. A threshold value is established for the target device. An acceptable value is established for the target device. A static charge is monitored for the target device. A corrective action is initiated if the static charge exceeds the threshold value. The static charge is monitored. The corrective action is halted if the static charge decreases below the acceptable value.

A method of fabricating a semiconductor device according to one aspect of the invention is disclosed. A wafer having at least one semiconductor layer is provided. A layer of photoresist is deposited. Portions of the layer of photoresist are exposed. The layer of photoresist is developed. The static charge on the wafer is controlled using an electrostatic discharge controller while drying the wafer. Critical dimensions of the wafer are measured using a scanning electron microscope.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following is a detailed description of the present invention made in conjunction with the attached figures, wherein like reference numerals will refer to like elements throughout. The invention provides methodologies and a system for monitoring and controlling electro static discharge during semiconductor fabrication.

Figure 3:
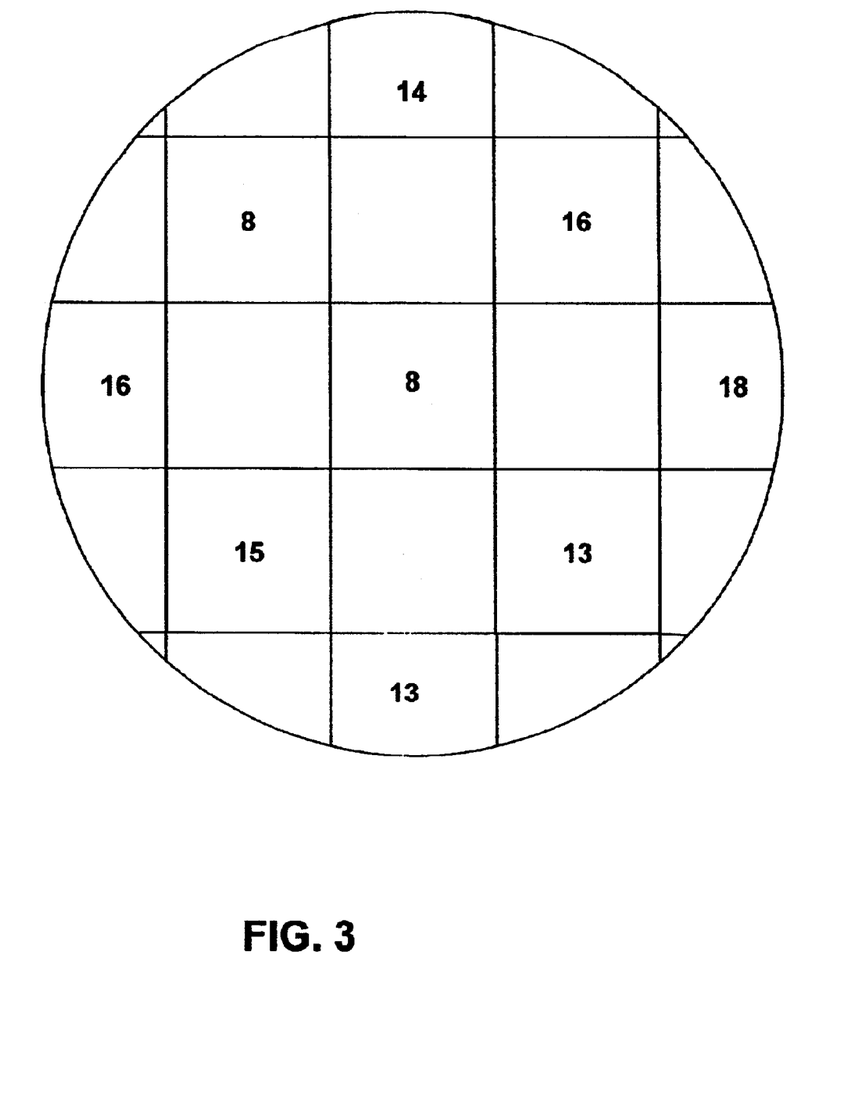
FIG. 3 illustrates an exemplary accumulation of static charge during processing of a wafer.
Figure 4:
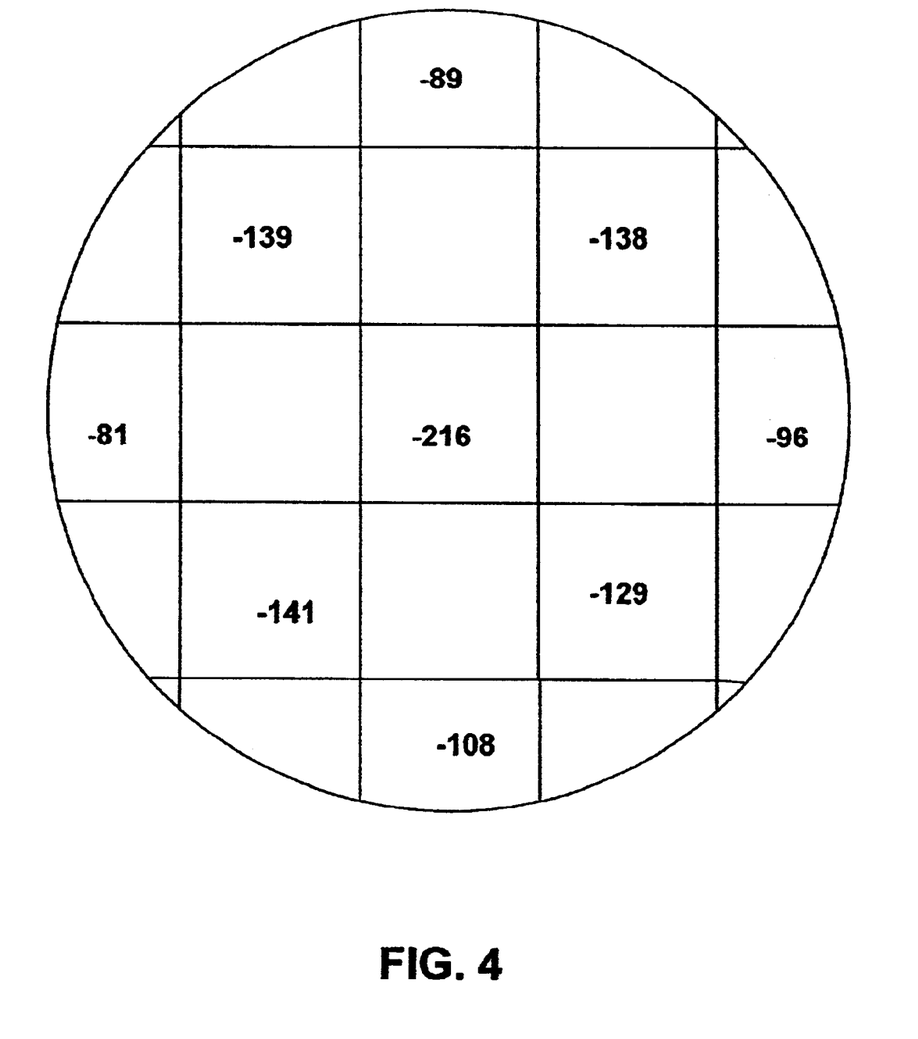
FIG. 4 illustrates an exemplary accumulation of static charge during processing of a wafer.

Referring now to the drawings, FIGS. 3 and 4 illustrate an exemplary accumulation of static charge on a wafer during contact mask processing. The wafer has semiconductor devices having metal thereon with a top layer being a thick dielectric. FIG. 3 illustrates a wafer map of static charge measured before resist is spun onto the wafer. The static charge is under 20 volts with the highest charge being seen on the edges of the wafer. These levels of static charge shown on the wafer are considered normal and do not, generally, interfere with further fabrication steps.

FIG. 4 illustrates a wafer map of static charge of the wafer after a conventional resist and develop step without the use of an electrostatic monitoring and control system. Conventional resist and/or development steps usually rotate wafers at high speeds. It is appreciated that processing steps, such as those which include high speed rotation of wafers can create similar or higher levels of static charge.

The static charge on the wafer of FIG. 4 is at high and dangerous levels. The static charge levels are negative, but will be discussed in absolute value terms. It can be seen that the static charge is as great as 216 volts near the wafer center. Lower levels of static charge are seen on the edges of the wafer, but even these lower levels are still high and problematic. For example, the lowest static charge detected on the wafer is 81 volts, which is a level high enough to interfere with further processing or fabrication steps. Static charges as high as 1000 volts have been detected in sample wafers.

High levels of static charge on a wafer, such as shown with respect to FIG. 4, can interfere with subsequent processing steps such as optical measurement, scanning, developing, masking, applying resist, applying antireflective coatings and the like. Further, such high levels of static discharge can lead to electrostatic discharges of 10 A or higher which can damage devices on the wafer and render the wafer useless. Furthermore, the electrostatic discharges can possibly interact with other chemicals used during fabrication processes.

FIG. 3 and FIG. 4 provide one example of static charge buildup on a wafer during processing. However, it is appreciated that the present invention is not limited to controlling static charge and preventing or reducing the occurrence of ESD of this one example. The present invention is applicable to any step or stage of semiconductor processing. Furthermore, it is appreciated that the present invention is applicable to reducing static charge, whether the static charge is positive or negative.

Figure 5:
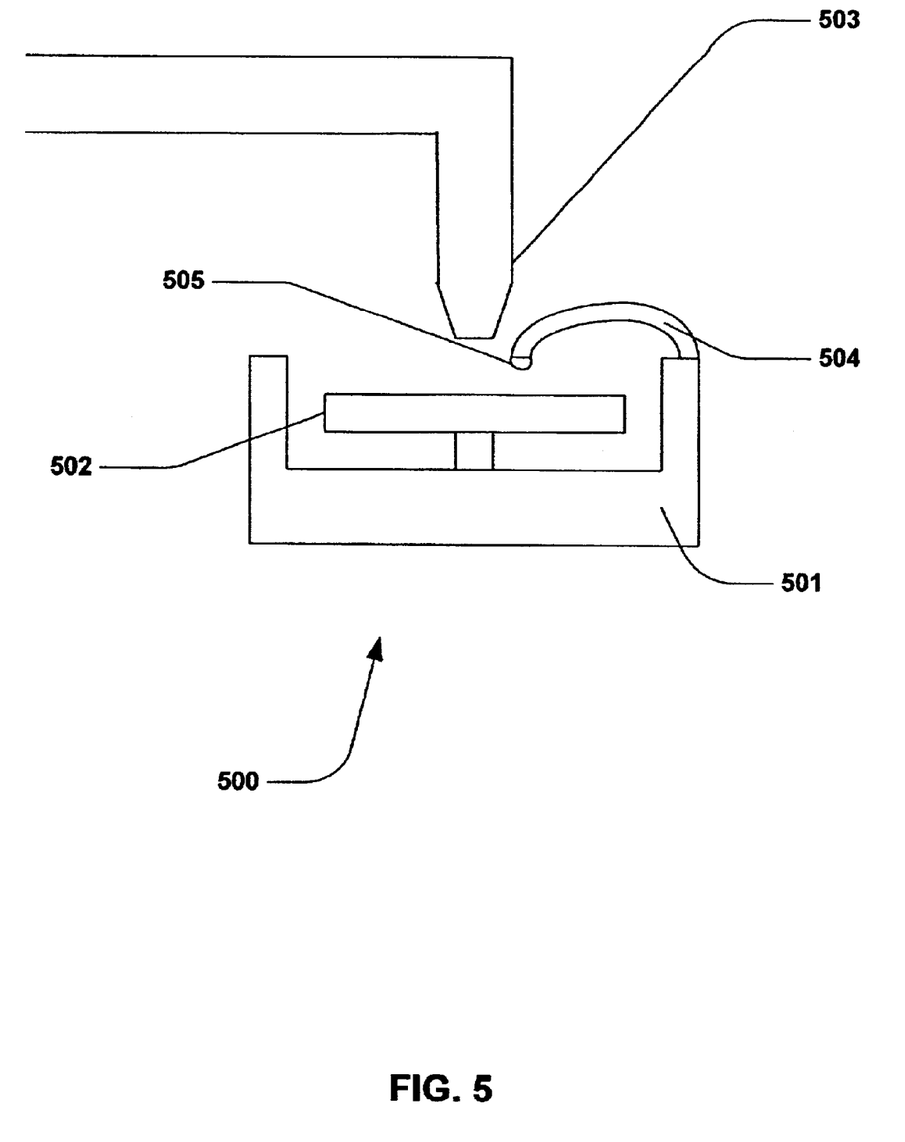
FIG. 5 is a side view of an electrostatic discharge monitor and control system.

FIG. 5 illustrates a side view of an electrostatic discharge monitor and control system 500 according to one aspect of the invention. The system 500 reduces or prevents the occurrence of an ESD by controlling static charge on a target device 502. The system 500 includes a cup holder 501, an antistatic solution dispenser 503, a sensor arm 504 and a sensor 505. The target device 502 is spun at a high speed. The target device may be a wafer or a mask The target device 502 has an upper surface.

A first end of the sensor arm 504 is attached to the cup holder 501. The sensor arm 504 is movable so that it can be moved away from the target device 502. example, the sensor arm 504 may be moved away from the target device 502 when an antistatic solution or other material is being dispensed on the target device 502. Additionally, the sensor arm 504 may be moved away from the target device for other processing steps. A sensor 505 is attached to a second end of the sensor arm 504. The sensor arm 504 positions the sensor 505 a determined distance above the surface of the target device 502. The sensor arm 504 is adjustable to vary the distance between the sensor 505 and the target device 502. It is appreciated that the sensor arm 504 can be moved during operation to monitor different locations of the target device, such as center or edge of the upper surface. For example, FIG. 4 shows that the highest levels of static charge after a resist step are found at the center of the wafer, so the sensor arm 504 may be positioned so that the sensor 505 is near the center of a wafer during resist application. In another example, highly sensitive devices may be at a certain location of the target device 504 so the sensor arm 504 can be used to position the sensor 505 near the certain location of the highly sensitive devices. It is appreciated that alternate aspects of the invention can include varying numbers of sensor arms and sensors, and still be within the scope of the present invention.

The sensor 505 monitors static charge buildup on the target device and sends that data through the sensor arm 504 to an ESD controller (not shown). The sensor 505 continues to monitor static charge buildup on the target device before, during and after dispensing antistatic solutions to provide feedback during the dispensing of the antistatic solution.. The sensor 505 may comprise any device capable of measuring a charge or static charge. For example, the sensor 505 may comprise a capacitor where the voltage across the capacitor represents the static charge buildup on the target device. For another example, the sensor 505 may comprise a dielectric layer formed in between two conductive layers. Contacts on the conductive layers are used to measure conductance through the dielectric layer, where the conductance corresponds to static charge. The sensor 505 is able to detect positive and/or negative values of static charge.

The antistatic solution dispenser 503 is located above the target device 502. The antistatic solution dispenser 503 dispenses or sprays an antistatic solution on the surface of the target device 502. The antistatic solution dispenser 503 is controlled by the ESD controller and dispenses the antistatic solution as directed by the ESD controller. The antistatic solution dispenser 503 may be used in processing to dispense other solutions, such as resist and developer solutions. The dispenser 503 dispenses the antistatic solution at a rate for a period of time as determined by the ESD controller.

The antistatic solution reduces static charge buildup on the target device 502. A variety of solutions may be used for the antistatic solution. The antistatic solution is dispensed when the sensor 505 detects a charge or voltage greater than a threshold value.

One type of antistatic solution is distilled (DI) water with a surfactant. A surfactant makes a solution more soluble. The DI water with a surfactant reduces static charge buildup on the target device 502.

Another type of antistatic solution is comprised of DI water and a dilute acetic solution. The dilute acetic acid reduces the pH of the antistatic solution and reduces static charge buildup on the target device 502.

Generally, any solution that neutralizes static charge accumulated at the surface of the target device 502 may be used. One example of is a dilute electrolyte solution of $10^{-2}$ to $10^{-5}$ parts HCl in DI water. Examples of some other acidic solutions that may be used without introducing undesirable contaminant ions include carbonic acid ($H_2CO_3$), phosphoric acid ($H_3PO_4$), HBr, HI and $HNO_3$. The amounts and concentrations of materials and solutions in the antistatic solution are selected to provide sufficient positive ions without substantially etching or contaminating the target device. The amounts and concentrations of materials and solutions in the antistatic solution can be altered by the antistatic solution dispenser 503 before, during and after dispensing of the antistatic solution.

The sensor 505 continues to monitor static charge while antistatic fluid s being dispensed by the antistatic solution dispenser 503 and sends the monitoring data, which provides feedback data to the ESD controller. The ESD controller can cause the antistatic solution dispenser 503 to adjust flow rates and/or composition of the antistatic solution based on the feedback data. For example, if the feedback data indicates that the static charge is still high or increasing despite the dispensing of antistatic solution, the flow rate can be increased and/or the composition of the antistatic solution can be altered to provide a stronger antistatic solution. As another example, if the feedback data indicates that the static charge is rapidly dropping but still above acceptable levels, the flow rate and be reduced and/or the composition of the antistatic solution can be altered to provide a weaker antistatic solution. Finally, once the feedback data from the sensor 505 indicates that the static charge has dropped below an acceptable level, the ESD controller stops the dispensing of the antistatic solution by the antistatic solution dispenser 503. Normal processing or fabrication of the target device can then be resumed.

Figure 6:
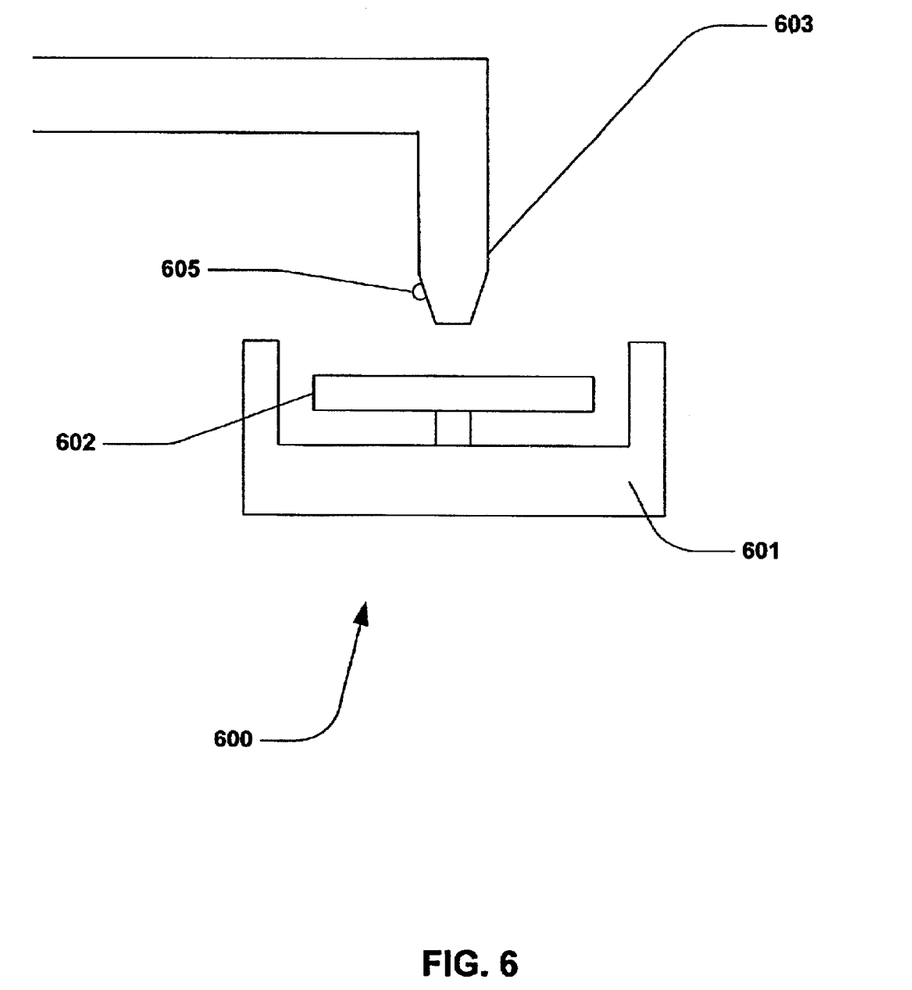
FIG. 6 is a side view of an electrostatic discharge monitor and control system.

FIG. 6 illustrates a side view of an electrostatic discharge monitor and control system 600 according to one aspect of the invention. The system includes a cup holder 601, an antistatic solution dispenser 603 and a sensor 605. The system monitors and controls static charge buildup on a target device 602. The target device 602, along with the cup holder 601, can be spun at a high speed to facilitate drying. The target device may be a wafer or a mask. The target device 602 has an upper surface.

A sensor 605 is attached to the antistatic solution dispenser 603. The sensor 605 is positioned a determined distance above the surface of the target device 602. The sensor 605 monitors static charge buildup on the target device and sends that data to an ESD controller (not shown). The sensor 605 may comprise any device capable of measuring a charge or static charge. For example, the sensor 605 may comprise a capacitor where the voltage across the capacitor represents the static charge buildup on the target device. For another example, the sensor 605 may comprise a dielectric layer formed in between two conductive, layers. Contacts on the conductive layers are used to measure conductance through the dielectric layer, where the conductance corresponds to static charge.

The antistatic solution dispenser 603 is located above the target device 602. The antistatic solution dispenser 603 dispenses or sprays an antistatic solution on the surface of the target device 602. The antistatic solution dispenser 603 is controlled by the ESD controller and dispenses the antistatic solution as directed by the ESD controller. The antistatic solution dispenser 603 may be used in processing steps to dispense other solutions, such as resist and developer solutions. The dispenser 603 dispenses the antistatic solution at a rate and composition determined by the ESD controller.

The antistatic solution reduces static charge buildup on the target device 602. A variety of solutions may be used for the antistatic solution. The antistatic solution is dispensed when the sensor 605 detects a charge or voltage greater than a threshold value.

One type of antistatic solution is distilled (DI) water with a surfactant. A surfactant makes a solution more soluble. The DI water with a surfactant reduces static charge buildup on the target device 602.

Another type of antistatic solution is comprised of DI water and a dilute acetic solution. The dilute acetic acid reduces the pH of the antistatic solution and reduces static charge buildup on the target device 602.

Generally, any solution that neutralizes static charge accumulated at the surface of the target device 602 may be used. One example of is a dilute electrolyte solution of $10^{-2}$ to $10^{-5}$ parts HCl in DI water. Examples of some other acidic solutions that may be used without introducing undesirable contaminant ions include carbonic acid ($H_2CO_3$), phosphoric acid ($H_3PO_4$), HBr, HI and $HNO_3$. The amounts and concentrations of materials and solutions in the antistatic solution are selected to provide sufficient positive ions without substantially etching or contaminating the target device. The amounts and concentrations of materials and solutions in the antistatic solution can be altered by the antistatic solution dispenser 603 before, during and after dispensing of the antistatic solution.

The sensor 605 continues to monitor static charge while antistatic fluid is being dispensed by the antistatic solution dispenser 603 and sends the monitoring data, which provides feedback data to the ESD controller. The ESD controller can cause the antistatic solution dispenser 603 to adjust flow rates and/or composition of the antistatic solution based on the feedback data. For example, if the feedback data indicates that the static charge is still high or increasing despite the dispensing of antistatic solution, the flow rate can be increased and/or the composition of the antistatic solution can be altered to provide a stronger antistatic solution. As another example, if the feedback data indicates that the static charge is rapidly dropping but still above acceptable levels, the flow rate and be reduced and/or the composition of the antistatic solution can be altered to provide a weaker antistatic solution. Finally, once the feedback data from the sensor 605 indicates that the static charge has dropped below an acceptable level, the ESD controller stops the dispensing of tile antistatic solution by the antistatic solution dispenser 503. Normal processing and/or fabrication of the target device can then be resumed.

Figure 7:
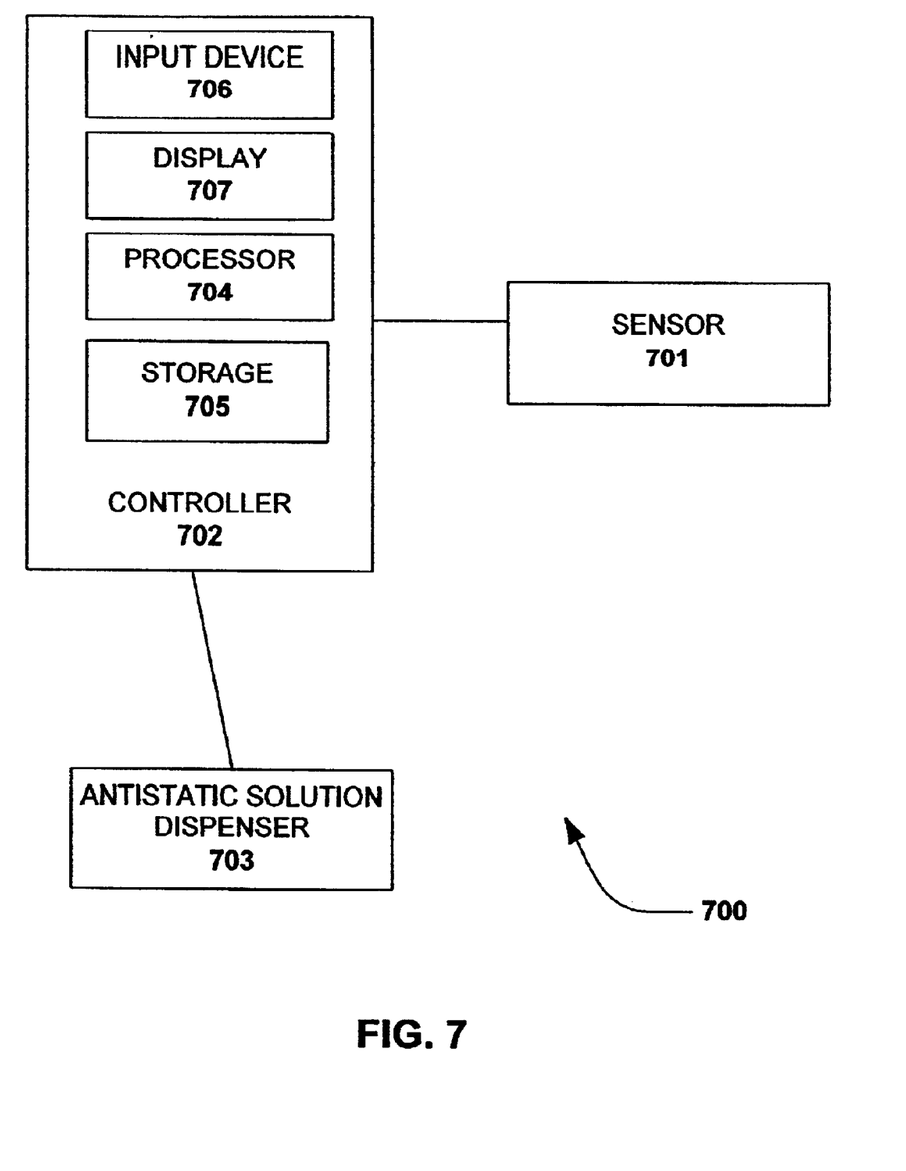
FIG. 7 is a block diagram of a static charge control and monitor system.

FIG. 7 illustrates a block diagram of a feedback based, static charge control system 700. The system 700 includes a sensor 701, an ESD controller 702 and an antistatic solution dispenser 703. The system 700 is generally responsible for controlling static charge buildup on a target device. The system 700 initiates and controls dispensing of antistatic solution as needed to control static charge buildup and reduce or prevent the occurrence of ESD.

The sensor 701 is coupled to the ESD controller 702 and is comprised of one or more individual sensors. The sensor 701 monitors the voltage or static charge buildup on a surface of a target device, such as a wafer or a mask. The target device may be similar to the target devices shown and described with respect to FIG. 5 and FIG. 6. The individual sensors may comprise any device capable of detecting a static charge, regardless of whether that charge is positive or negative. For one example, the individual sensors may comprise a capacitor where the voltage across the capacitor represents the static charge buildup on the surface of the target device. For another example, the individual sensors may comprise a dielectric layer formed in between two conductive layers. The sensor 701 may monitor the static charge on a portion of the surface, on selected portions of the surface or may monitor the entire surface. Thus, the individual sensors may be located at a portion, selected portions or over the entire surface. The individual sensors may form a matrix to monitor the covered portions. The sensor 701 collects feedback data and sends it to the ESD controller 702. The feedback data includes static charge measurements for the individual sensors of the sensor 701. Generally, as shown with respect to FIG. 4, the highest levels of static charge buildup occur near the center of the target device. The sensor 701 is provides the feedback data at an update frequency. For example, the sensor 701 may provide the feedback data every micro second. Generally, the sensor 701 provides the feedback data to the ESD controller 702 at all times including before, during and after dispensing of an antistatic solution. However, the ESD controller 702 may control the providing or sending of data and may also control the update frequency. For example, it may be desirable to increase the update frequency during dispensing of the antistatic solution to more closely monitor the effects of the solution. For another example, the sending of data may be unnecessary for various stages of fabrication.

The antistatic solution dispenser 703 is coupled to the ESD controller 702. The antistatic solution dispenser 703 dispenses an antistatic solution as directed by the ESD controller 702. The antistatic solution dispenser 703 dispenses the antistatic solution, as directed by the ESD controller 702, according to a variety of parameters including, but not limited to, flow rate, flow duration and solution composition. These parameters can be adjusted as needed during dispensing of the antistatic solution to increase or decrease the reduction of static charge. For example, if the feedback data indicates that the static charge is not dropping or is not dropping fast enough, the flow rate can be increased and/or the composition of the antistatic solution can be adjusted.

The ESD controller 702 includes at least one processor 704 and a memory 705. The ESD controller 702 may additionally include an input device 706 and a display.707. The at least one processor 704 may be any of a plurality of processors, such as the AMD K6, ATHLON or other similar processors. The manner in which the at least one processor 704 can be programmed to carry out the functions relating to the present invention will be readily apparent to those having ordinary skill in the art based on the description herein.

The memory 705 serves to store program code executed by the at least one processor 704 for carrying out operating functions of the system as described herein. The memory 705 may include read only memory (ROM) and random access memory (RAM) The ROM contains, among other code, the Basic Input-Output System (BIOS) which controls the basic hardware operations of the system 700. The RAM is the main memory into which the operating system and application programs are loaded. The memory 705 also serves as a storage medium for temporarily storing information such as monitoring data, acceptable values of static charge, threshold values of static charge, other data and algorithms that may be employed in carrying out the present invention. The memory 705 may additionally include a hard disk drive or other mass storage device.

The input device 706 comprises one or more input devices such as a keyboard and mouse. The display device 707 is used for displaying textual and graphical information for an operator to view.

The processor 704 of the ESD controller 702 receives and analyzes the feedback data from the sensor 701. The processor 704 initiates a corrective action when the static charge is greater than a threshold value. The threshold value may be determined by the processor 704 of the ESD controller 702 or set by an operator. The operator may set the threshold value by utilizing the input device 706. The corrective action comprises dispensing an antistatic solution while continuing to receive and monitor feedback data. The ESD controller 702 also selects the parameters to be used in dispensing of the antistatic solution and can adjust those parameters as needed throughout the antistatic dispensing process. The dispensing of the antistatic solution may be terminated when the static charge drops below an acceptable value. In alternate, aspects, the dispensing of the antistatic solution is terminated after a determined time period, where the time period is a function of the static charge and acceptable levels of static charge. The acceptable value is less than or equal to the threshold value. DI water is then dispensed to remove any remaining antistatic solution from the target device.

The processor 704 of the ESD controller 702 can determine the effectiveness of various antistatic solutions by monitoring and collecting the feedback data for the static charge before, during and after corrective actions. For example, the ESD controller may determine that a lower flow rate with a stronger composition provides better results than a higher flow rate with a weaker composition. Further, the processor 704 of the ESD controller 702 may modify parameters to be used in Future corrective actions. In an alternate aspect of the invention, the corrective action includes a number or series of repeated smaller actions, which may be performed until the static charge drops below an acceptable value.

The threshold value and acceptable value are chosen so as to prevent excessive static charge buildup while reducing the number of corrective actions performed. Corrective actions may delay processing and have a small risk of damaging the target device, thus it may be desirable to reduce the number of corrective actions performed during fabrication.

Figure 8:
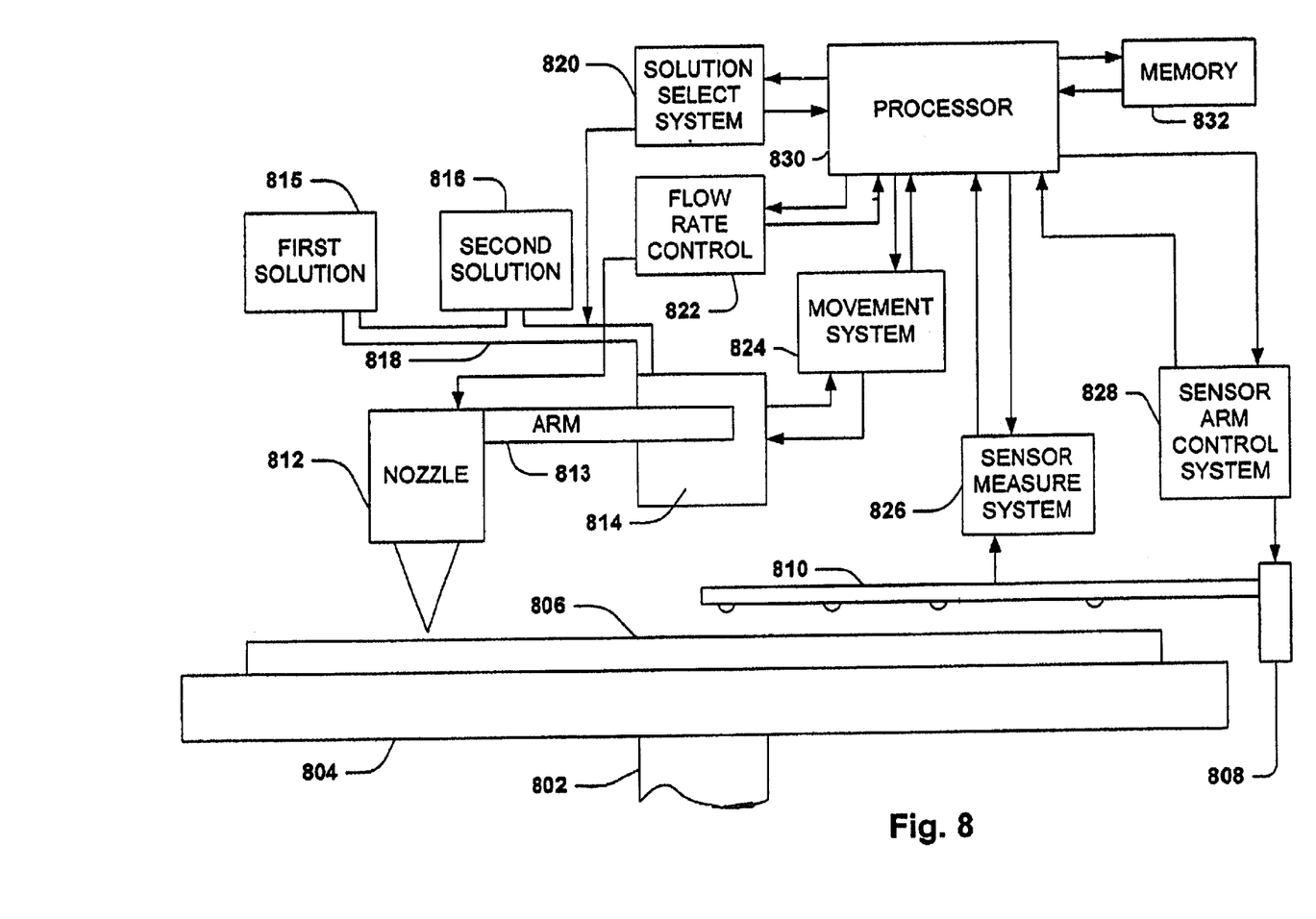
FIG. 8 is a block diagram of a feedback based static charge control and monitor system.

FIG. 8 illustrates a feedback based static charge control system according to one aspect of the invention. The system controls and prevents the buildup of static charge during semiconductor or mask fabrication steps. Generally, the system monitors static charge on a surface of a wafer or mask and dispenses an antistatic solution as needed. The system performs a corrective action when static charge builds up beyond an acceptable threshold.

A processor 830 may be any of a plurality of processors, such as the AMD K6, ATHLON or other similar processors. The manner in which the processor 830 can be programmed to carry out the functions relating to the present invention will be readily apparent to those having ordinary skill in the art based on the description herein.

A memory 832 is coupled to the processor 830. The memory 832 serves to store program code executed by the processor 830 for carrying out operating functions of the system as described herein. The memory 832 may include read only memory (ROM) and random access memory (RAM). The ROM contains, among other code, the Basic Input-Output System (BIOS) which controls the basic hardware operations of the system. The RAM is the main memory into which the operating system and application programs are loaded. The memory 832 also serves as a storage medium for temporarily storing information such as monitoring data, acceptable values of static charge, threshold values of static charge, other data and algorithms that may be employed in carrying out the present invention. The memory 832 may additionally include a hard disk drive or other mass storage device.

A shaft 802 is connected to a target device chuck 804. The shaft is typically connected to a motor (not shown) and rotates as desired. The target device chuck 804 holds a target device 806. The target device 806 has an upper surface. The target device 806 can be a wafer or a mask at a stage of fabrication.

A sensor arm 808 positions an array of sensors 810 above the target device 806 by a distance at a device location. The sensor arm 808 is capable of movement in at least 2 axis in order to adjustment of the distance and location positioning of the array of sensors 810. The movement of sensor arm 808 is controlled by the sensor arm control system 828.

The array of sensors 810 measures static charge of the target device 806. The array of sensors includes an arm and a number of sensors. The array of sensors 810 can include any number of individual sensors. The array of sensors 810 is able to measure positive and negative values of static charge.

The sensor arm control system 828 is coupled to the sensor arm 808 and the processor 830. As stated above, the sensor arm control system 828 controls the movement of the sensor arm 808 and, thereby, the positioning of the array of sensors 810. The sensor arm control system 828 permits detecting and monitoring various locations of the target device 806. As discussed earlier, static charge buildup can vary across a device so the sensor arm control system 828 permits monitoring of that variation.

A sensor measurement system 826 is connected to the array of sensors 810 and the processor 830. The sensor measurement system 826 retrieves measurement data from the array of sensors 810 and provides that data as feedback data to the processor 830. The sensor measurement system 826 is responsible for determining when and how often to send the feedback data to the processor 830. In other aspects of the invention, the sensor measurement system 826 processes the measurement data before sending the feedback data. The sensor measurement system 826 provides feedback data before, during and after a corrective action. Parameters such as, frequency of data, resolution, average, duration and the like can be controlled or set by the processor 830.

A nozzle 812 is included in the system to dispense an antistatic solution. The nozzle 812 is positioned at a location above the target device 806. The nozzle 812 is able to adjust a flow rate of the antistatic solution. The flow rate is adjusted to enhance and/or improve the effects of the antistatic solution while reducing potential damage to the target device 806. A higher flow rate provides better static charge reduction but has an increased risk of damage to the target device compared to a lower flow rate that provides less static charge reduction but a lower risk of damage. The flow rate is controlled by a flow rate control system 822. The flow rate control system 822 is connected to the nozzle 812 and the processor 830. The flow rate control system 822 adjusts the flow rate as determined by the processor 830 based on the feedback data.

A nozzle arm 813 supports the nozzle 812 and connects the nozzle 812 to the nozzle base 814. The nozzle arm 813 permits passage of the antistatic solution to the nozzle 812. The nozzle base 814 positions the nozzle arm 813 and thereby the nozzle 812. The nozzle base 814 is movable to adjust positioning of the nozzle arm 813 and the nozzle 812, in multiple axes, so that the antistatic solution can be dispensed in locations having the highest static charge buildup. The movement of the nozzle base 814 is controlled by the movement control system 824. The movement control system 824 is connect to the nozzle base 814 and the processor 830. The movement control system 824 positions the nozzle 812 as needed during processing or during a corrective action. The movement control system 824 can adjust movement during a corrective action to more evenly dispense the antistatic solution. The processor 830 controls the movement system 824 based on the feedback data.

The nozzle base 814 also receives and passes the antistatic solution from a solution connector component 818 and to the nozzle arm 813. The solution connector component 818 is connected to the nozzle base 814, a first solution and a second solution. The solution connection component 818 combines the first solution 815 and the second solution 816 as directed by a solution select system 820. This combination of the first solution 815 and the second solution 816 yields the antistatic solution. The first solution 815 and the second solution 816 may be comprised as described with respect to other figures. Varying combinations provide varying strengths of the antistatic solution. The solution select system controls the combination and the composition of the antistatic solution. It is appreciated that the present invention is not limited to a number of solutions comprising the antistatic solution. Other aspects may include any number of solutions as components of the antistatic solution.

As discussed above, the processor 830 controls the solution select system 820, the flow rate control system 822, the movement control system 824, the sensor measurement system 826 and the sensor arm control system 828. The processor 830 receives the feedback data and initiates and halts corrective actions as necessary. The corrective action generally includes dispensing of the antistatic solution. Furthermore, the processor 830 continues to receive feedback data during corrective actions and adjusts the systems as needed. The processor 830 initiates a corrective action when feedback data indicates that static charge has built up beyond a threshold value. The processor adjusts parameters for the various control systems based on feedback data received during the corrective action. Finally, the processor 830 halts or ends the corrective action when feedback data indicates that static charge has dropped below an acceptable value.

It is appreciated that a portion or all of the system of FIG. 8 may be used in other processing steps. Fore example, nozzle 812 may be used to dispense other solutions such as photoresist. Furthermore, it is appreciated that alternate aspects may include locating the array of sensors 810 on the nozzle 812 or nozzle arm 813.

Figure 9:
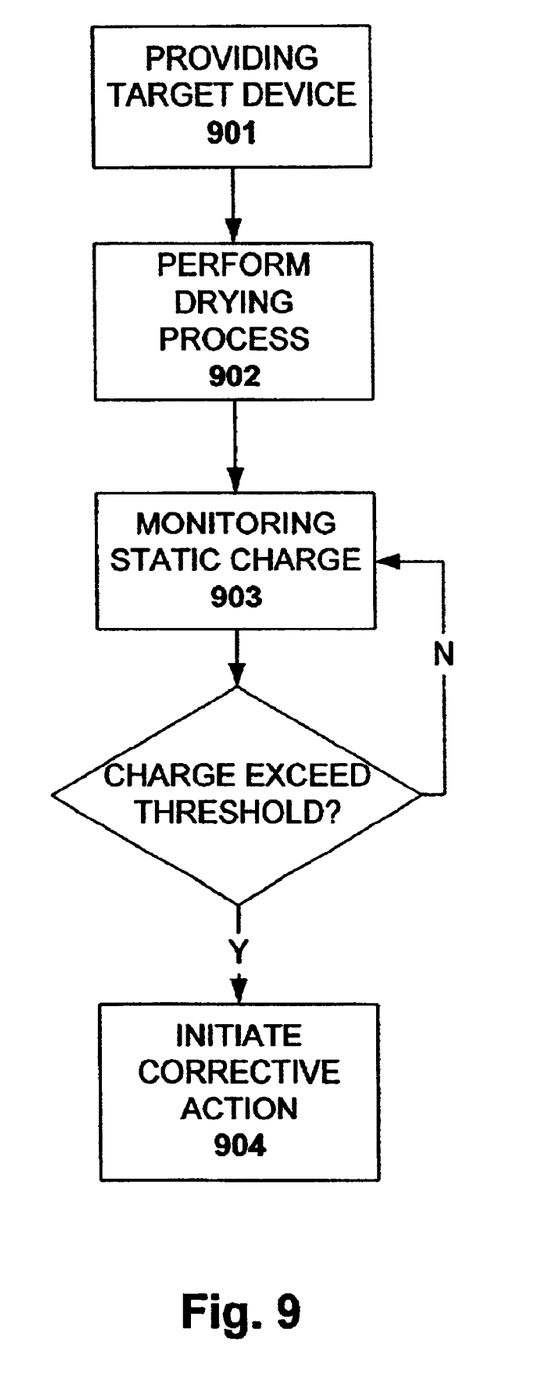
FIG. 9 is a flow diagram illustrating a methodology for monitoring and controlling ESD.

FIG. 9 is a flow diagram of a method for monitoring and controlling ESD according to one aspect of the invention. Controlling ESD is obtained by controlling and reducing static charge or static charge buildup. A target device is provided at block 901. The target device is a wafer or a mask. The target device is, typically, partially through a series of fabrication steps. If the target device is a wafer, the wafer may have at least one semiconductor layer present and may have a number of semiconductor devices on or in the wafer. If the target device is a mask, the mask may have one or more patterns formed in the mask. The target device has a surface or upper surface of which static charge buildup is monitored.

The target device undergoes a drying process at block 902. The drying process includes an accelerated spinning of the target device. The drying process may be performed for a number of reasons including, but not limited to, drying resist, photoresist, antireflective coatings, developer, or some other composition. The drying process dries the upper surface of the target device.

While drying, a surface of the target device is monitored for static charge at block 903. It is appreciated that alternate aspects of the invention may monitor the surface during fabrication processes other than drying and still be within the scope of the present invention. On the static charge of the surface of the target device exceeding a threshold value, initiating a corrective action at block 904. The corrective action includes interrupting the drying process, optionally dispensing DI water on the target device, dispensing an antistatic solution on the target device, optionally dispensing DI water on the target device and resuming the drying process. Additionally, dispensing of the antistatic solution includes adjusting parameters such as flow rate, solution composition and time based on the monitored static charge. Thus, the parameters can be adjusted as needed to reduce the static charge as fast or as slow as needed.

Figure 10:
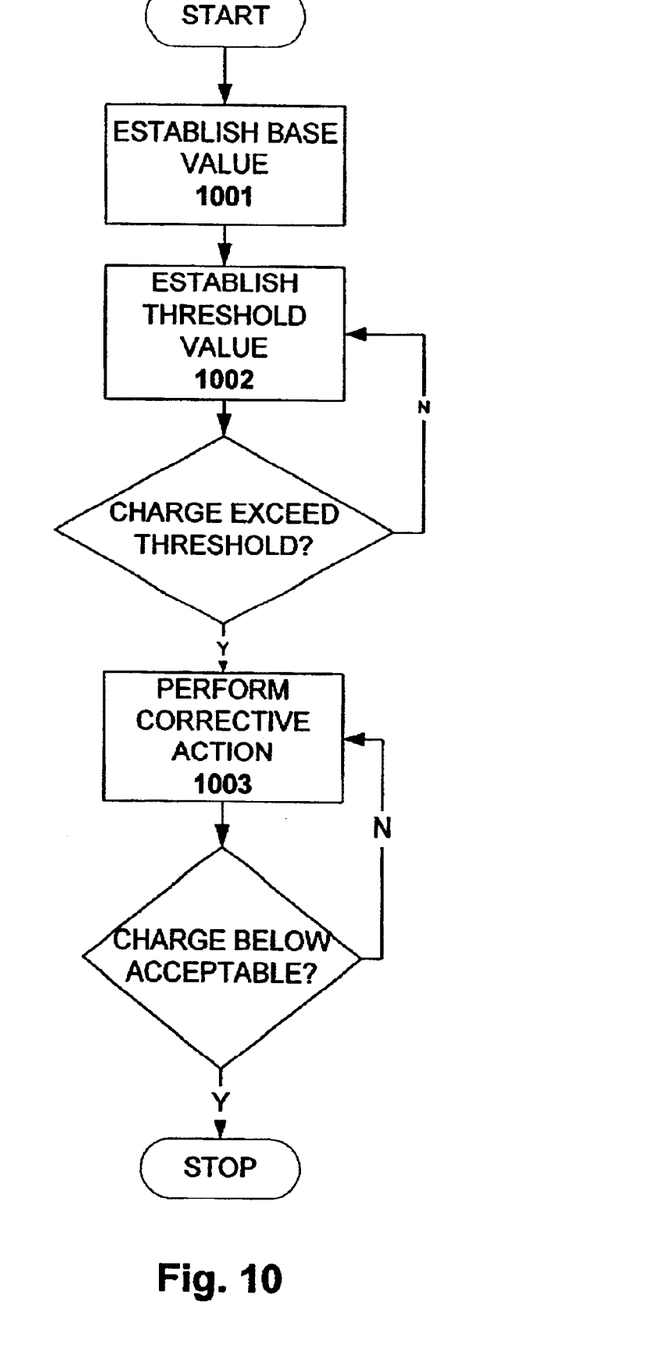
FIG. 10 is a flow diagram illustrating a methodology for monitoring and controlling ESD.

FIG. 10 is a flow diagram of a method for monitoring and controlling ESDs according to one aspect of the invention. The ESD is controlled by reducing or preventing ESD with respect to a target device such as a wafer or mask. Generally, the occurrence of ESD is reduced or prevented by monitoring and controlling static charge buildup on the wafer. A base value for static charge is established at block 1001. The base value is a non-destructive value of static charge. The base value varies for different types of target devices and can vary for different stages of processing. Certain stages of processing or fabrication may include layers that are highly sensitive to static charge. Some exemplary values of typical base values for a wafer having a thick dielectric layer on its upper surface are 8–16 volts.

A threshold value is established at block 1002. The threshold value is a value below a critical or destructive value. As with the base value, the threshold value varies between different types of target devices and can vary for different stages of processing. The threshold value is set to be below the critical or destructive value by an amount that provides a certain safety factor with respect to the critical or destructive value. A critical or destructive value is a static charge level or static charge buildup that may damage or interfere with fabrication of a target device. As with the base value, the critical or destructive value can vary for different target devices and different stages of processing. Exemplary values of critical or destructive values for a wafer having a thick dielectric layer as its upper surface are 80 to 200 volts. It is appreciated that the base value, threshold value and critical value can have positive values, negative values or absolute values.

On a static charge of the target device exceeding the threshold value, a corrective action is initiated until the static charge of the target device drops below an acceptable value at block 1003. The acceptable value is an acceptable level or value of static charge. The acceptable value is greater than the threshold value and less than the destructive value. The acceptable value is chosen so as to reduce the time required for the corrective action while. permitting the static charge of the target device to be reduced to an acceptable value. Some exemplary values of acceptable values are static charge levels of 20 to 40 volts, in absolute value terms.

Figure 11:
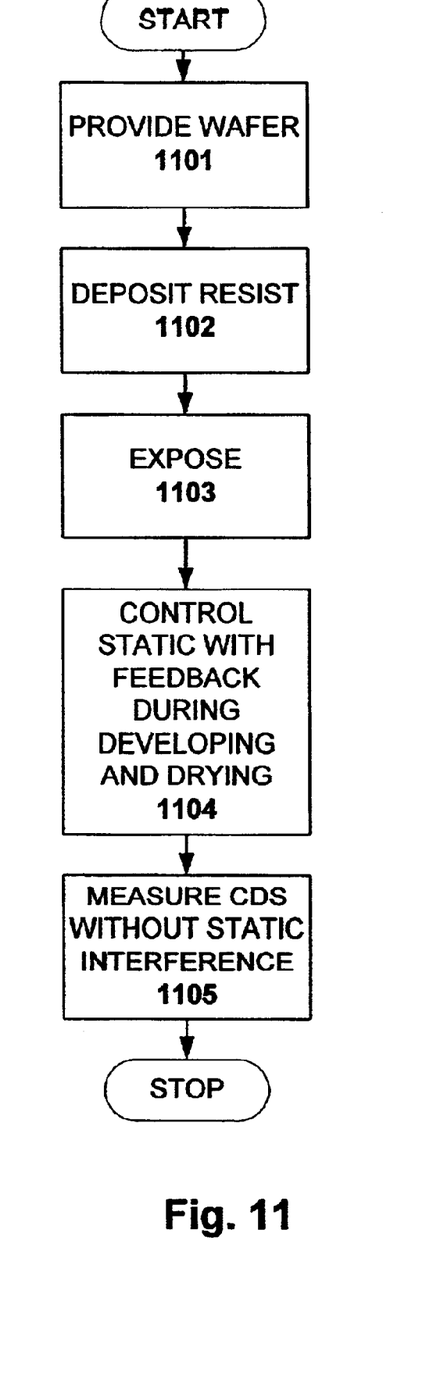
FIG. 11 is a flow diagram illustrating a methodology of fabricating a semiconductor device.

FIG. 11 is a flow diagram of a method of fabricating a semiconductor device according to one aspect of the invention. A wafer having at least one semiconductor layer is provided at block 1101. A layer of photoresist is deposited over the at least one semiconductor layer at block 1102. The photoresist can be applied a number of ways, including spraying or applying with a nozzle. Additionally, the wafer may be spun to more evenly distribute and/or dry the photoresist. Exposing portions of the layer of photoresist at block 1103. Conventional methods of photolithography may be used to expose portions of the layer of photoresist Typically a resist mask is used to expose the portions of the photoresist layer and to prevent other portions from being exposed.

Static charge on the wafer is controlled using an ESD controller with feedback during developing and drying the wafer at block 1104. Developing generally comprises applying a developer composition that reacts with either the exposes portions of the photoresist layer or the other, non-exposed portions of the photoresist, The reacted photoresist becomes soluble and is then removed permitting subsequent processing steps to operate on only those areas where the photoresist has been removed. The drying step performed with respect to block 1104 ensures that remaining photoresist has sufficiently dried to allow further processing or fabrication steps. Critical dimensions (CDs) of semiconductor devices on the wafer are measured using a scanning electron microscope (SEM) at block 1105. The measured CDs are substantially equal to the actual CDs of the semiconductor devices. It is appreciated that static charge can also be controlled by the present invention in other processing steps such as applying resist and/or drying resist.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. An electrostatic discharge monitor and control system comprising:
    a cup holder to hold a target device;
    an antistatic solution dispenser positioned above the target device to dispense an antistatic solution on the target device;
    a sensor arm attached to the cup holder;
    a sensor attached to the sensor arm and positioned a determined distance above the target device, the sensor monitors a static charge of the target device and provides feedback data; and
    a feed back control system operatively connected to the antistatic solution dispenser, the sensor arm and the sensor, the feed back control system controls a static charge of the target device via discharge adjustment of the anti-static solution.

2. The electrostatic discharge monitor and control system of claim 1, wherein the target device is a wafer having at least one semiconductor device.

3. The electrostatic discharge monitor and control system of claim 1, wherein the target device is a mask.

4. The electrostatic discharge monitor and control system of claim 1, wherein the antistatic solution dispenser further dispenses distilled water.

5. The electrostatic discharge monitor and control system of claim 1, wherein the antistatic solution dispenser further dispenses resist.

6. The electrostatic discharge monitor and control system of claim 1, wherein the antistatic solution dispenser further dispenses developer.

7. The electrostatic discharge monitor and control system of claim 1, wherein the antistatic solution comprises distilled water and a surfactant.

8. The electrostatic discharge monitor and control system of claim 1, wherein the antistatic solution comprises distilled water and a dilute acetic acid.

9. An electrostatic discharge regulator comprising:
    means for holding a target device;
    dispensing means for dispensing an anti-static solution on the target device;
    means for monitoring a static discharge of the target device and
    means for controlling the dispensing means based on data received from the monitoring means.

10. The electrostatic discharge monitor and control system of claim 1, wherein the target device is a wafer.

11. The electrostatic discharge monitor and control system of claim 1, wherein the antistatic solution comprises a first solution and a second solution.

12. The electrostatic discharge monitor and control system of claim 11, wherein the first solution is stronger with respect to reducing static charge than the second solution.

13. The electrostatic discharge monitor and control system of claim 12, wherein amounts of the first solution and amounts of the second solution are varied to achieve a desired strength of the antistatic solution.

14. The electrostatic discharge monitor and control system of claim 1, wherein the antistatic solution comprises distilled water and a material selected from the group comprising $H_2CO_3$, $H_3PO_4$, HBr, HI and $HNO_3$.

15. An electrostatic discharge monitor and control system comprising:

a sensor to monitor static charge on a surface of a target device;

an antistatic solution dispenser able to dispense an antistatic solution upon the surface at a selected flow rate; and a controller coupled to the sensor and the antistatic solution dispenser to analyze static charge data from the sensor and automatically initiate dispensing of the antistatic solution on the target device.

16. The electrostatic discharge monitor and control system of claim 15, wherein the sensor comprises a plurality of individual sensors.

17. The electrostatic discharge monitor and control system of claim 15, wherein the sensor monitors portions of the surface.

18. The electrostatic discharge monitor and control system of claim 15, wherein the sensor monitors the entire surface.

19. The electrostatic discharge monitor and control system of claim 15, wherein the controller analyzes the effectiveness of the antistatic solution.

20. A method comprising:

providing a target device;

performing a drying process;

monitoring static charge on a surface of the target device during the drying process; and on the static charge exceeding a threshold value, initiating a corrective action via contacting the target device with an anti-static substance.

21. The method of claim 20, wherein initiating the corrective action further comprises:

setting a flow rate and composition for an antistatic solution;

dispensing the antistatic solution according to the flow rate and composition while continuing to monitor static charge on the surface of the target device;

adjusting the flow rate and composition based on the monitored static charge;

halting dispensing of the antistatic solution on the monitored static charge falling below an acceptable level.

22. The method of claim 21, wherein setting the composition comprises selecting amounts of at least one solution to comprise the antistatic solution.

23. The method of claim 20, wherein performing a drying process comprises an accelerated spinning of the target device.

24. The method of claim 21, wherein initiating the corrective action comprises:

interrupting the drying process;

dispensing distilled water on the target device;

dispensing an antistatic solution on the target device;

dispensing distilled water on the target device; and resuming the drying process.

25. A method of controlling static charge comprising:

establishing a base value for a target device;

establishing a threshold value for the target device;

establishing an acceptable value for the target device;

monitoring a static charge for the target device;

bringing the target device in contact with an anti-static substance, on the static charge exceeding the threshold value;

continuing to monitor the static charge; and on the static charge decreasing below the acceptable value, halting the corrective action.

26. The method of claim 25, wherein establishing a threshold value comprises determining the threshold value as a function of the base value.

27. The method of claim 25, wherein establishing an acceptable value comprises determining an acceptable value based on the target device.

28. The method of claim 25, wherein establishing an acceptable value includes determining an acceptable value based on reducing the time required for the corrective action while reducing the static charge for the target device.

29. A method of fabricating a semiconductor device comprising:

providing a wafer having at least one semiconductor layer;

depositing a layer of photoresist over that at least one semiconductor layer;

exposing portions of the layer of photoresist;

developing the layer of photoresist;

controlling static charge on the wafer using an electrostatic discharge controller while drying the wafer; and measuring critical dimensions of the wafer using a scanning electron microscope.

30. The method of claim 29, wherein measuring critical dimensions comprises obtaining critical dimension measurements substantially equal to actual critical dimension measurement.

* * * * *